United States Patent [19]
Cimock et al.

[11] Patent Number: 5,321,591
[45] Date of Patent: Jun. 14, 1994

[54] TOY FLASHLIGHT STROBE MODULE

[75] Inventors: Benjamin Cimock, Altamonte Springs; Eric Gatley, Ocoee, both of Fla.; Patrick Chau, Aberdeen; John Lam, Hong Kong, both of Hong Kong

[73] Assignee: I & K Trading Co., Vienna, Va.

[21] Appl. No.: 994,033

[22] Filed: Dec. 21, 1992

[51] Int. Cl.⁵ ................................................ F21L 7/00
[52] U.S. Cl. ...................................... 362/186; 362/102; 362/109; 362/205; 315/200 A; 315/241 S; 446/473; 446/485
[58] Field of Search ............... 362/102, 109, 114, 119, 362/120, 186, 202, 205, 208, 811; 315/200 A, 227 R, 241 S; 446/473, 485

[56] References Cited

U.S. PATENT DOCUMENTS

| | | | |
|---|---|---|---|
| 4,068,149 | 1/1978 | Wuchinich | 315/200 A |
| 4,453,140 | 6/1984 | Gindrup | 315/200 A |
| 4,678,450 | 7/1987 | Scolari et al. | 362/102 |
| 5,005,004 | 4/1991 | Udofot | 362/802 |

FOREIGN PATENT DOCUMENTS 0004459 of 1902 United Kingdom ............... 362/120

*Primary Examiner*—Ira S. Lazarus
*Assistant Examiner*—Alan B. Cariaso
*Attorney, Agent, or Firm*—Stroock & Stroock & Lavan

[57] ABSTRACT

A toy flashlight formed in a configuration including a strobe module. The flashlight includes a handle housing and a releasably mounted transparent enclosure with the strobe module enclosed therebetween. The strobe module is provided to switch a light source between ON state and an OFF state to create a rapidly blinking light. Further, a strobing circuit is provided to control the switching mechanism of the strobe module. In this manner, the strobe module with strobing circuit can be inserted into a conventional flashlight to enhance its play value.

17 Claims, 3 Drawing Sheets

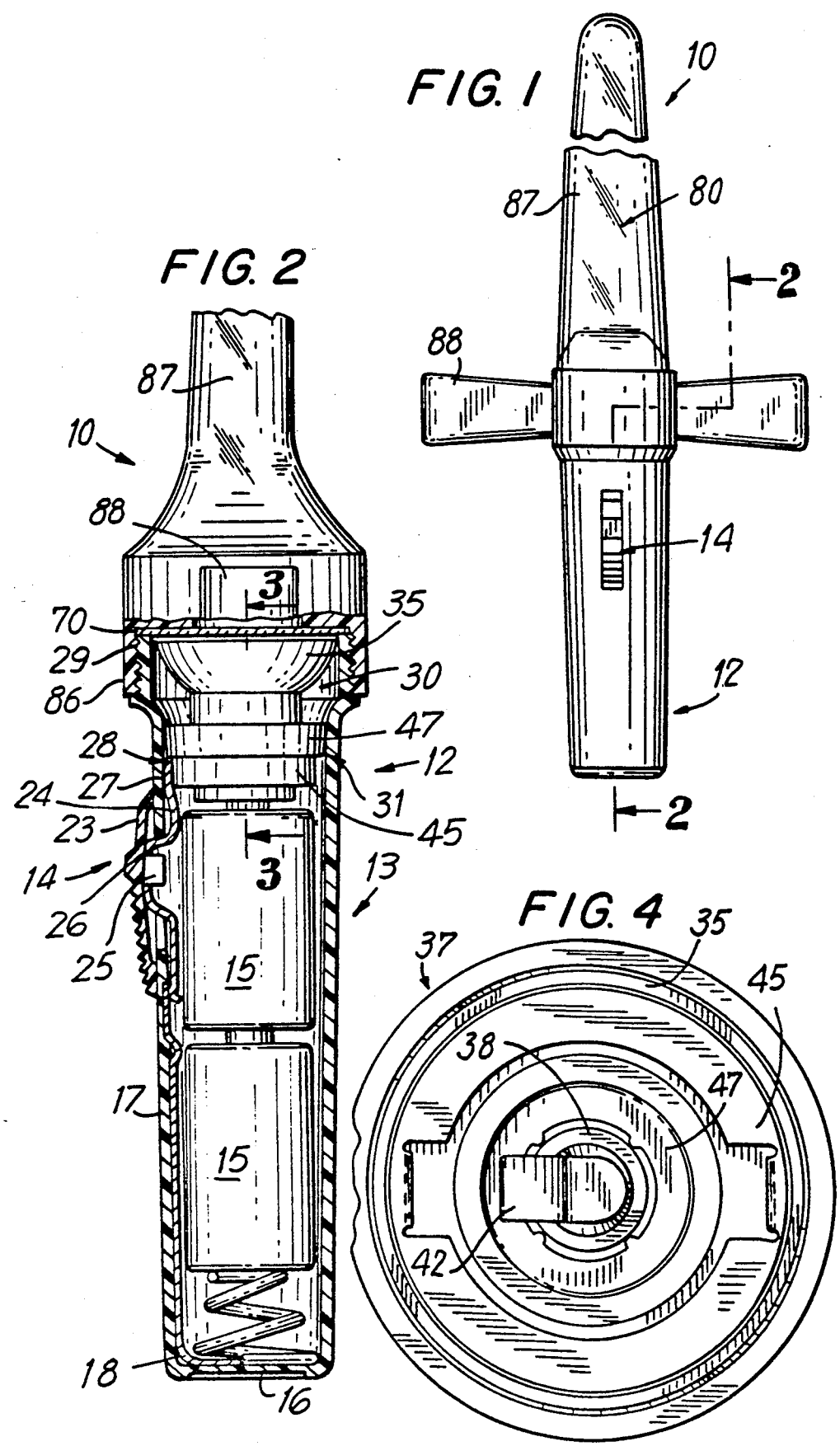

TOY FLASHLIGHT STROBE MODULE

BACKGROUND OF THE INVENTION

This invention is directed to a novel toy flashlight module and, in particular, to a toy flashlight having a strobe module which rapidly emits beams of light t provide distinct types of play value.

Toy flashlights have taken many shapes, forms and styles over the years. In fact, toy flashlights are known in the prior art as exemplified in U.S. Pat. No. 5,037,346. U.S. Pat. No. 5,037,346 is directed to a toy flashlight having a color filter assembly which is mounted to a handle housing and contains a variety of colored filters. Light beams are then transmitted through the colored filters. A globe is attached to the colored filter assembly of the flashlight and includes reflective objects in a variety of colors and shapes. Therefore, when the child moves the flashlight, colored beams of lights are reflected off the objects enclosed in the globe. Although such a flashlight can provide considerable enjoyment for a child, such flashlights do not necessarily offer a futuristic appeal and play value.

Accordingly, the present invention provides a toy flashlight that has a futuristic and a high technology-like special effect. More specifically, the toy flashlight module of the present invention includes a strobe module which produces a rapidly blinking beam of light. Accordingly, an improved toy flashlight module which emits rapidly blinking lights and, hence, provides enhanced play value is desired.

SUMMARY OF THE INVENTION

Generally speaking, in accordance with the instant invention, a toy flashlight module assembly is provided. The toy flashlight includes a handle housing for receiving a power supply. A light source is releasably mounted within the handle for emitting a beam of light. A strobe module is mounted to the handle for controlling the output of the beam of light. A transparent enclosure is secured to the handle housing so that the light is rapidly emitted through the transparent enclosure.

In an exemplary embodiment, a strobe module is formed with a strobing circuit for switching the beam of light between an ON state and an OFF state. The strobing circuit is formed with a Darlington circuit having a master transistor and a slave transistor coupled to a light source for producing a beam of light. An RC circuit is coupled to the base of the master transistor and the collector of the slave transistor. The power supply is coupled to the master transistor and the light source. In this manner, a circuit is formed which rapidly switches the beam of light between an ON state and an OFF state to provide enhanced play value to a flashlight.

Accordingly, it is an object of the instant invention to provide an improved amusement device in the form of a toy flashlight having a strobe module.

A further object of the invention is to provide a flashlight toy which can provide rapidly blinking light to create a futuristic effect.

Still a further object of the invention is to provide a strobing circuit which is inserted into a conventional toy flashlight and rapidly switches a beam of light of the flashlight between an ON state and an OFF state.

Still other objects and advantages of the invention will in part be obvious and will in part be apparent from the specification.

The invention accordingly comprises the features of the construction, combination of elements and arrangement of parts which will be exemplified in the construction hereinafter set forth, and the scope of the invention will be indicated in the claims.

BRIEF DESCRIPTION OF THE DRAWINGS

For a fuller understanding of the invention, reference is had to the following description taken in connection with the accompanying drawings, in which:

FIG. 1 is a front plan view of a flashlight in the form of a toy sword including a strobe module constructed in accordance with a preferred embodiment of the invention;

FIG. 2 is a sectional view taken along line 2—2 of the amusement device of FIG. 1;

FIG. 4 is a sectional view taken along line 4—4 of FIG. 3;

DETAILED DESCRIPTION OF THE PREFERRED EMBODIMENTS

Figure 3:
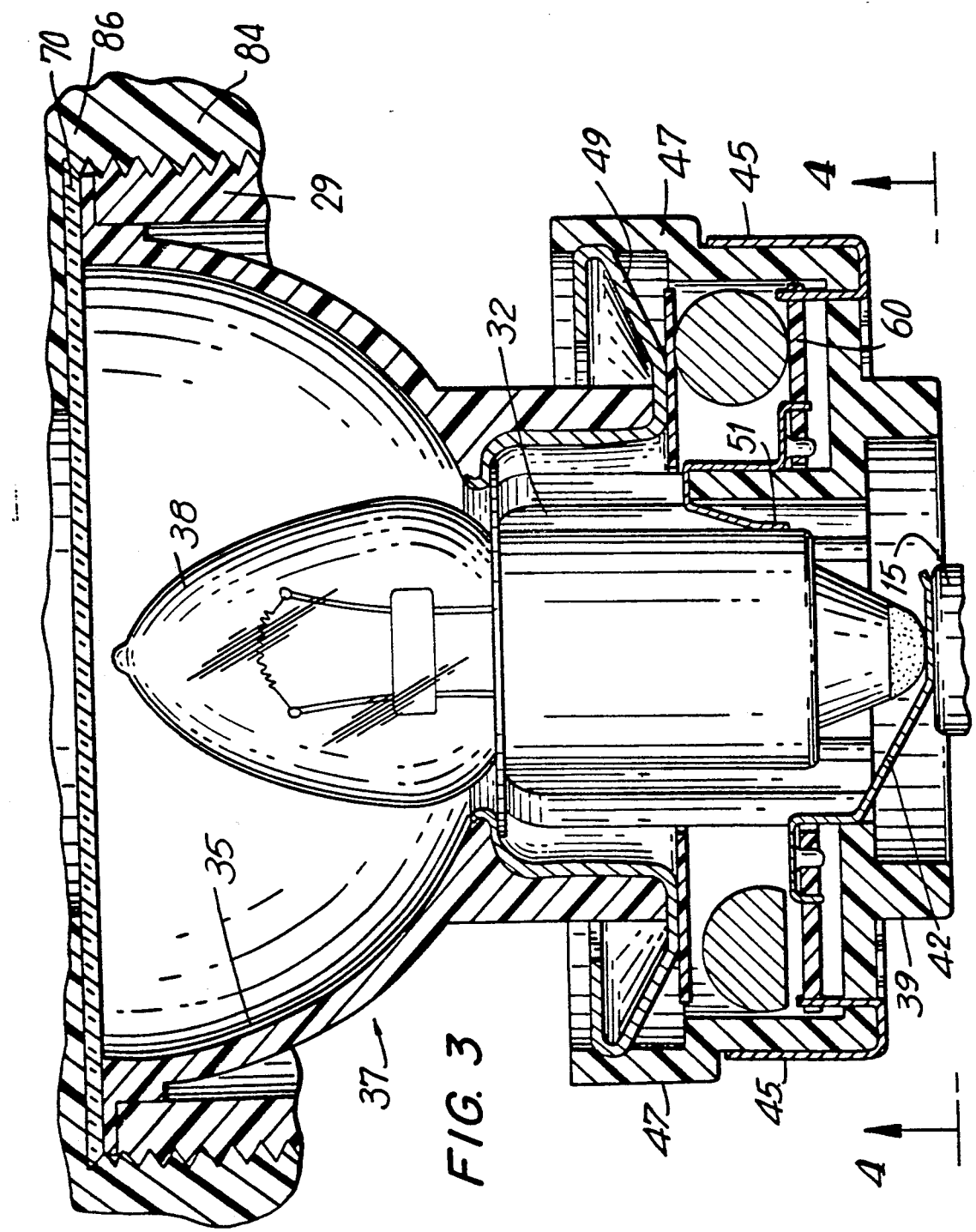
FIG. 3 is a sectional view taken along line 3—3 of FIG. 2.
Figure 5:
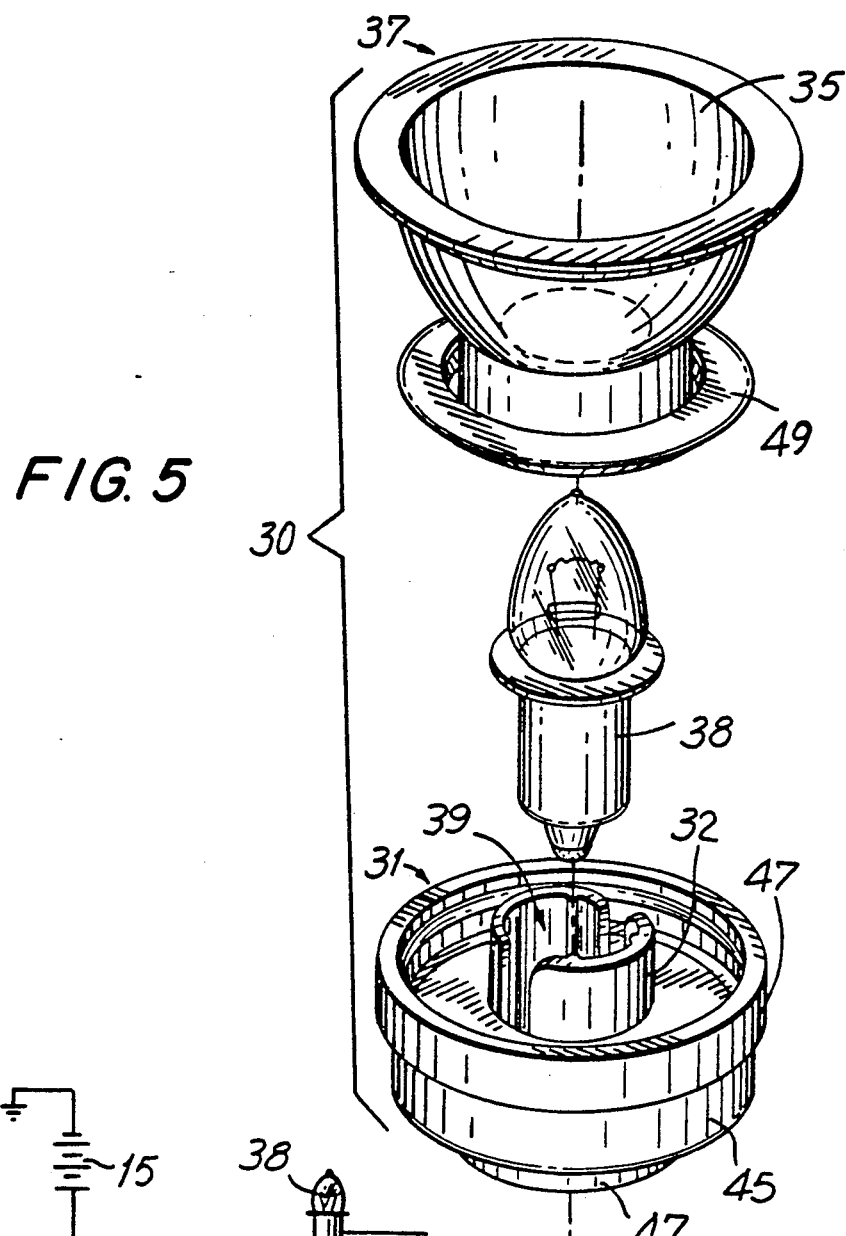
FIG. 5 is an exploded perspective view of the strobe module constructed in accordance with the preferred embodiment of the embodiment.

Reference is first made to FIGS. 1 and 2, wherein a toy flashlight in the shape of a sword generally indicated as 10, is depicted. Flashlight 10 includes a handle assembly generally indicated as 12 identified as having a displaceable on-off switch assembly generally indicated as 14. Handle assembly 12 supports a strobe module assembly generally indicated as 30. A sword assembly 80 is mounted onto handle assembly 12 enclosing strobe module 30 therebetween. Further, although sword assembly 80 is formed with a blade 87 and a hilt 88, it is understood that the instant invention contemplates other types of lenses, shapes, figures or combinations thereof that can be secured to handle assembly 12 that are suitable for use with the strobe module of the instant invention.

Referring specifically now to FIGS. 2-5, handle assembly 12 includes a cylindrical housing 13 for receiving and positioning batteries 15 therein. In particular, handle housing 13 includes an end wall 16 and a cylindrical side wall 17. Cylindrical side wall 17 includes an open end 28.

A lead plate 18 is disposed against the side of end wall 16 and extends along cylindrical wall 17 to switch assembly 14. A conductive spring 19 is disposed against lead plate 18 to position batteries 15 in housing 13. Conductive spring 19 contacts the negative terminal of battery 15 and thereby couples batteries 15 to lead plate 18.

Switch assembly 14 is a conventional switching mechanism and includes a switch plate 23 and an elongated bent conductive lead 24 secured switch plate 23 by inserting a projection 25 on switch plate 23 into an opening 26 in conductive lead 24. Conductive lead 24 includes a contact 27 which extends towards an open end 28 of cylindrical housing 13. At open end 28 of cylindrical housing 17 are threads 29 annularly disposed above the open end of housing 13 for releasably receiving sword 80.

Strobe module 30 includes a housing 31 having a flashlight bulb supporting wall 32. Further, strobe module 30 includes a reflector 37 for insertion into strobe housing 31. Reflector 37 includes an inwardly radially disposed wall 35 having an opening 36 therein. In this arrangement, reflector 37 formed with a reflective material is adapted to receive a conventional flashlight bulb 38. However, in a preferred embodiment, flashlight bulb 38 is a prefocused light bulb.

A collar 39 is inserted in opening 36 of reflector 37 to hold flashlight bulb 38 in position. Collar 39 is formed by supporting walls 32 which extends into cylindrical housing 13. In this construction, flashlight bulb 38 is positioned so that it contacts positive terminal lead 42 which then connects to the positive terminal of battery 15 in a conventional manner. In addition, a transparent circular lens 70 is placed on top of reflector 37 to further control the light path emitted from flashlight bulb 38. Lens 70 may be formed of any color to enhance the play value of flashlight 10 by creating a variety of colored lights.

Figure 6:
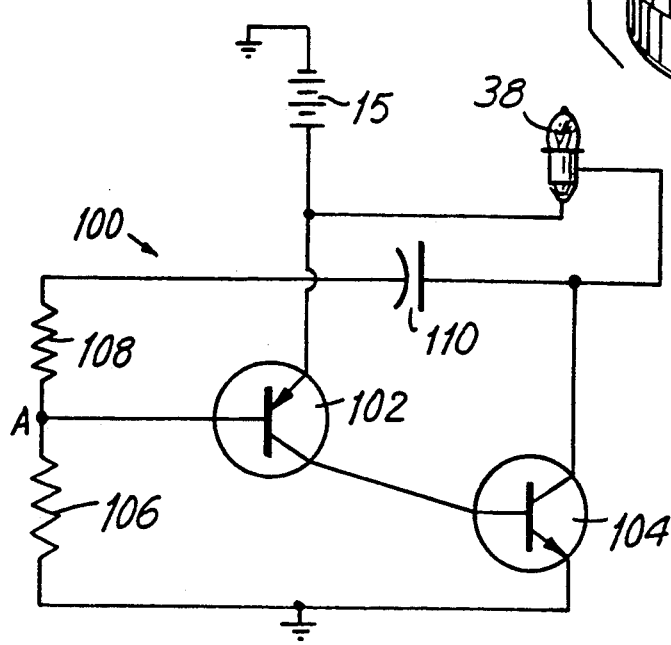
FIG. 6 is a circuit diagram of the strobing circuit of the present invention.

Strobe housing 31 is formed with a strobing circuit support 47. Coupled to the bottom wall of strobing circuit support 47 is a conductive collar 45. Conductive collar 45 surrounds the bottom wall of the strobing circuit support 47. However, conductive collar 45 is formed so that positive terminal lead 42 is exposed to contact battery 15. Conductive collar 45 is constructed and arranged to make contact with contact 27 of switch assembly 14. Further, enclosed in strobe housing 31 is an integrated circuit board 60. Circuit board 60 incorporates strobing circuit 100, as shown in FIG. 6 which is discussed in detail below. Circuit board 60 is coupled to switch assembly 14 by positive terminal lead 42 which in turn is coupled to the positive terminal of battery 15 and flashlight bulb 38. Circuit board 60 is coupled to flashlight bulb 38 by conductive lead 51 which electrically couples flashlight bulb 38 and circuit board 60. Circuit board 60 is coupled through conductive collar 45 to the negative terminal of battery 15.

In order to define a closed circuit in flashlight 10, switch assembly 14 is moved towards sword 80 to the "closed" position shown in FIG. 2. In the "closed" position, conductive lead 24 contacts conductive collar 45 of strobe housing 31, and thus supplies current to strobe module 30 in a conventional manner. Further, positive terminal lead 42 connects between the positive terminal of battery 15 to circuit board 60 and flashlight bulb 38. Flashlight bulb 38 also connects through conductive lead 51 to circuit board 60.

Reference is now made to FIG. 6 which is a schematic of strobing circuit 100. A master transistor 102 and a slave transistor 104 are coupled to form a composite pair wherein the input resistance of slave transistor 104 constitutes the emitter load for master transistor 102. More specifically, the combination of master transistor 102 and slave transistor 104 form a Darlington circuit.

A drain resistor 106 is connected to the base of master transistor 102 and the emitter of slave transistor 104 to provide a bias current to the transistor. Flashlight bulb 38 acts as the load for the circuit and is connected to the collector of the Darlington circuit. More specifically, the cathode of flashlight bulb 38 is connected to the collector of slave transistor 104, while the anode of flashlight bulb 38 is connected to the emitter of master transistor 102.

A resistor 108 and an electrolytic capacitor 110 are connected in series to form an RC circuit. The RC circuit is connected to the collector of slave transistor 104, the base of master transistor 102 and resistor 106. In this configuration, the RC circuit provides a path of positive feedback for the circuit. In turn, the RC circuit causes an oscillation to start and then drive strobing circuit 100. The frequency of oscillation depends on the RC constant of resistor 108 and capacitor 110. In other words, the frequency of oscillation may be decreased by increasing both the resistance and the capacitance of resistor 108 and capacitor 110, respectively. Further, the output of resistor 106 connected to the emitter of slave transistor 104 is referenced to ground. Also, the collector of master transistor 102 is coupled to the base of transistor 104. Finally, battery 15 supplies power to the circuit and is coupled to the anode of flashlight bulb 38 and the emitter of master transistor 102.

In this construction, once switch assembly 14 is in a closed position, battery 15 applies a voltage of 3 volts across the circuit. In response thereto, capacitor 110 charges and it also causes master transistor 102, a PNP transistor, to be reverse biased and turn on. Once transistor 102 is turned on, slave transistor 104, a PNP transistor, is also turned on which grounds the anode of flashlight bulb 38, thereby defining a closed loop so that flashlight bulb 38 is turned on. Once slave transistor 104 turns on, the voltage across capacitor 110 begins to discharge. In response thereto, a higher voltage at the base of master transistor 102 is created which turns master transistor 102 off since it is no longer reversed biased.

Once master transistor 102 turns off, slave transistor 104 is also turned off, since no current flows through the emitter collector path of master transistor 102. Therefore, flashlight bulb 38 is turned off. When flashlight 38, master transistor 102, and slave transistor 104 are in an off-state, capacitor 110 will immediately begin to charge again. This rapidly switching condition is continuously repeated causing flashlight bulb 38 to strobe according to the time constant of capacitor 110 and the values of resistors 106 and 108 in the circuit until batteries 15 are disconnected from the circuit.

In an exemplary embodiment, batteries 15 are two 1.5 volt batteries; flashlight bulb 38 has a resistance of 0.9 ohms; master transistor 102 is a 2023 Radio Shack transistor; slave transistor 104 is a 1670 Radio Shack transistor. Drain resistor 108 has a value of 100 k$\Omega$; resistor 108 has a resistance of 4.7 k$\Omega$; and capacitor 110 has a value of 2.2 $\mu$F.

Accordingly, when switch assembly 14 is displaced into a "closed" position, strobe module 30 receives power to activate strobing circuit 100. Flashlight bulb 38 rapidly switches between an ON state and an OFF state to create a rapidly blinking light to enhance the play value of flashlight 10. Further, sword 80 can be constructed in a variety of forms and shapes. For example, in an alternative embodiment, sword 80 may take the form of a cartoon or a fairy tale character, a rounded color transparent globe as shown in U.S. Pat. No. 5,037,346 or any other similar embodiment.

Moreover, the instant invention is characterized by a flashlight that is capable of imparting a distinct type of play value. More specifically, a rapidly blinking light can be emitted from the top flashlight to create a futuristic element to an otherwise conventional toy. Further, the invention provides for a strobe module having a strobing circuit that can be used in conventional flashlights. Therefore, the strobe module may added to enhance the play value of a variety of flashlight toys.

It will thus be seen that the object set forth above, among those made apparent from the preceding description are efficiently attained and, since certain changes may be made in the above construction without departing from the spirit and the scope of the invention, it is intended that all matters contained in the above description or shown in the accompanying drawings shall be interpreted as illustrated and not in a limiting sense.

It is also understood that the following claims are intended to cover all of the generic and specific features of the invention herein described and all statements of the scope of the invention which, is a matter of language, might be said to fall therebetween.

What is claimed is:

1. An amusement device comprising handle means for receiving a power supply therein, light source means releasably mounted to said handle means for emitting a beam of light, strobe means mounted to said handle means for controlling the output of said beam of light, said strobe means including a Darlington circuit having a first transistor and a second transistor, said first transistor having an emitter and a base, said second transistor having an emitter and a collector, said emitter of said first transistor and said collector of said second transistor coupled to said light source; an RC circuit coupled to said base of said first transistor and to said collector of said second transistor; a drain resistor coupled to said RC circuit, said base of said first transistor and said emitter of said second transistor and said power supply coupled to said emitter of said first transistor and said light source, said handle means including a switching means connected to said light source means, said power supply and said strobe means for supplying power to said strobe means and a substantially transparent enclosure means releasably mounted to said handle means so that said beam of light transmits through said transparent enclosure; wherein said strobe means turns said light source means to an on state and an off state so that said beam of light blinks.

2. The amusement device of claim 1, wherein said light source means is a light bulb.

3. The amusement device of claim 1, wherein said transparent enclosure is a sword to provide additional play value.

4. The amusement device of claim 3, wherein said sword includes a blade and a hilt.

5. A strobing circuit for switching a light source between an on state and an off state, comprising:
a Darlington circuit having a first transistor and a second transistor, said first transistor having an emitter and a base, said second transistor having an emitter and a collector, said emitter of said first transistor and said collector of said second transistor coupled to said light source;
an RC circuit coupled to said base of said first transistor and to said collector of said second transistor;
a drain resistor coupled to said RC circuit, said base of said first transistor and said emitter of said second transistor; and
power supply means coupled to said emitter of said first transistor and said light source for driving said strobing circuit.

6. The strobing circuit of claim 5, wherein said first transistor includes a collector.

7. The strobing circuit of claim 6, wherein said second transistor includes a base, said base of said second transistor coupled to said collector of said first transistor.

8. The strobing circuit of claim 5, wherein said first transistor is a master transistor.

9. The strobing circuit of claim 5, wherein said second transistor is a slave transistor.

10. The strobing circuit of claim 5, wherein said drain resistor has a value of 100 kΩ.

11. The strobing circuit of claim 5, wherein said resistor of said RC circuit has a value of 47 kΩ.

12. The strobing circuit of claim 5, wherein said capacitor of said RC circuit has a value of 2.2 μF.

13. The strobing circuit of claim 5, wherein said power supply supplies 3.0 volts to said circuit.

14. The strobing circuit of claim 5, wherein said light source is a prefocused bulb having a resistance of 0.9 Ω.

15. A strobing circuit for rapidly switching a light source between an on state and an off state, comprising:
power supply means for supplying charge to the circuit;
charging means for storing the charge received from the power supply means for a predetermined period of time; and
switching means for switching between the on state and the off state based on the charge of the charging means; said switching means including a first transistor and a second transistor, said first transistor having an emitter and a base, said second transistor having an emitter and a collector, said emitter of said first transistor and said collector of said second transistor coupled to said light source; said charging means coupled to said base of said first transistor and said collector of said second transistor, the switching means being in the on state when the charge is stored in the charging means; the switching means being in the off state when no charge is stored in the charging means;
the light source being in the on state for the predetermined period of time of the charging means when the switching means is in the on state and the light source is in the off state when the switching means is in the off state.

16. The strobing circuit of claim 15, wherein when said first transistor is in the on state, the second transistor is in the on state.

17. The strobing circuit of claim 16, wherein the charging means is a RC circuit including a resistor and a capacitor.

* * * * *